United States Patent
Melnick et al.

[11] Patent Number: 5,998,258
[45] Date of Patent: Dec. 7, 1999

[54] METHOD OF FORMING A SEMICONDUCTOR DEVICE HAVING A STACKED CAPACITOR STRUCTURE

[75] Inventors: Bradley M. Melnick; Robert E. Jones; Douglas R. Roberts, all of Austin, Tex.

[73] Assignee: Motorola, Inc., Schaumburg, Ill.

[21] Appl. No.: 09/064,076

[22] Filed: Apr. 22, 1998

[51] Int. Cl.⁶ .................................................. H01L 21/8242
[52] U.S. Cl. ............................................................ 438/253
[58] Field of Search ........................... 438/253, 254–256, 438/239, 243, 250; 257/301, 306

[56] References Cited

U.S. PATENT DOCUMENTS

| | | | |
|---|---|---|---|
| 5,285,092 | 2/1994 | Yoneda ..................................... | 257/306 |
| 5,381,302 | 1/1995 | Sandhu et al. .......................... | 361/305 |
| 5,510,651 | 4/1996 | Maniar et al. ........................... | 257/751 |
| 5,559,047 | 9/1996 | Urabe ........................................ | 437/41 |
| 5,668,041 | 9/1997 | Okudaira et al. ....................... | 438/240 |
| 5,717,250 | 2/1998 | Schuele et al. .......................... | 257/754 |

OTHER PUBLICATIONS

Kohyama et al., "A fully Printable, Self–aligned and Planarized Stacked Capacitor DRAM Cell Technology for 1Gbit DRAM and Beyond," 1997 Symposium on VLSI Technology Digest of Technical Papers. pp. 17–18.

Kim et al., "Highly Manufacturable 1Gb SDRAM," 1997 Symposium on VLSI Technology Digest of Technical Papers, pp. 9–10.

*Primary Examiner*—Chandra Chaudhari
*Assistant Examiner*—Craig Thompson
*Attorney, Agent, or Firm*—Robert A. Rodriguez

[57] ABSTRACT

The present invention is a process for forming a lower capacitor electrode. Specifically, an oxygen tolerant bottom electrode layer (312) is formed over a conductive plug (216). A dielectric layer (420) is deposited and partially removed in order to form an inlaid bottom electrode structure. A capacitor dielectric (810) such as BST is formed over the lower electrode (310). The upper electrode (812) is formed over the capacitor dielectric (810) and the resulting stack is patterned in order to form a final capacitive device (916). In another embodiment of the present invention, a hardmask is formed over the bottom electrode (310) and removed prior to the capacitor dielectric (810) being formed.

29 Claims, 4 Drawing Sheets

METHOD OF FORMING A SEMICONDUCTOR DEVICE HAVING A STACKED CAPACITOR STRUCTURE

COPENDING RELATED APPLICATION

A related application having application Ser. No. 08/963,143 was filed with the USPTO on Nov. 3, 1997.

1. Field of the Invention

The present invention is drawn to semiconductor devices in general, particularly, a method of forming a semiconductor device having a stacked capacitor structure.

2. Background of the Invention

A known semiconductor structure including a stacked capacitor is illustrated. More particularly, FIG. 1 illustrates a substrate 10, formed of a semiconductor material, such as doped silicon. It is noted that several active devices are formed along substrate 10, although not illustrated. An interlayer dielectric 12 is deposited so as to overlie substrate 10, through which various contacts 14 are formed. The contacts are generally formed of tungsten or doped polysilicon, and provide electric contact between active devices along substrate 10, and an overlying stacked capacitor, described herein. Two stacked capacitors are shown in FIG. 1, each including a barrier layer 15. The barrier layer may be formed of a nitride, such as titanium nitride, and functions to prevent diffusion of oxygen to contacts 14 during high temperature processing of a later formed capacitor dielectric layer, as well as to prevent interdiffusion between bottom electrode 16 and contact 14. The bottom electrodes 16 provide one of the two electrodes of each of the capacitors, and may be formed of various materials, including iridium and platinum. Spacers 20 are formed in a conventional manner (i.e., blanket deposition of SiO2 or SiN, followed by an anisotropic etch). As noted, the two bottom electrodes 16 illustrated in FIG. 1 are spaced relatively close to each other, such that bridging can occur between adjacent spacers, as illustrated. A capacitor dielectric layer 22 is deposited so as to overly the bottom electrodes 16, followed by deposition of top electrode 24, and hard mask 26. It is noted that the spacers 20 are provided to prevent deposition of the capacitor dielectric 22 directly along the side walls of the bottom electrode 16, to smooth the topography of the bottom electrodes, and to increase the lateral diffusion path of oxygen, which prevents oxidation of the contacts 14. In this regard, while the bottom electrode 16 is formed of a single layer, it may have a composite layer structure as is known in the art.

The present inventors have recognized several problems associated with the prior art structure shown in FIG. 1. First, it has been recognized that the capacitor dielectric layer, which may be formed of BST (Barium-Strontium-Titanate), may be locally thinned, resulting in a "pinch-off" region 22a between the bottom electrode 16 and the top electrode 24. This locally thinned region is undesirable, as it results in a high field region of the capacitor structure, resulting in undesirable leakage current and possible device reliability issues.

The hard mask 26 may be formed of several materials, including titanium nitride and tantalum nitride. These materials are typically deposited by PVD (physical vapor deposition), particularly, sputtering. The present inventors have recognized that locally thinned regions 26a appear along sloping regions of the capacitor structure. These locally thinned regions 26a are problematic. Particularly, following deposition of hard mask 26, the mask is patterned so as to define edges 28. After completion of patterning of the hard mask 26, the top electrode 24 and the capacitor dielectric 22 are patterned (i.e. those portions exposed by the mask 26 are removed). The locally thinned regions of hard mask 26 do not provide adequate protection of the top electrode 24 during etching. Accordingly, those portions below or underlying the locally thinned regions 26a may be undesirably removed, which may even result in exposure of the capacitor dielectric 22, which is undesirable. Accordingly, a need exists in the art to overcome the problems associated with the prior art device shown in FIG. 1, including formation of pinch-off regions of the capacitor dielectric, as well as locally thinned regions of the hard mask 26.

U.S. Pat. No. 5,668,041 to Okudaira et al. discloses another prior art stacked capacitor structure, wherein the bottom electrode of the capacitor is inlaid in a dielectric layer. In one particular embodiment in the '041' patent, a contact opening is defined within a dielectric layer, the contact opening is filled with a conductive material, to define a contact. Thereafter, a second dielectric layer is deposited over the contact, and a trench is defined within the first and second dielectric layers, in which a bottom electrode for a capacitor structure is formed, by blanket deposition of a barrier layer and an electrode layer, followed by chemical mechanical polishing (CMP) so as to define the bottom electrode, inlaid within a dielectric material. See FIG. 41 of the '041' patent. The device is finished by depositing appropriate dielectric and top electrode layers.

The present inventors have recognized deficiencies with the process of the '041' patent. Particularly, the upper surface of the bottom electrode layer of the '041' patent is defined by CMP. During polishing, the upper surface of the bottom electrode is susceptible to scratching, which is undesirable. Particularly, the interface between the bottom electrode and the later deposited dielectric layer is critical, and scratches may contribute to undesirable electrical properties. Further, the manufacturability of the device disclosed in the '041' patent is difficult, since appropriate slurry chemistries for the CMP process are under continued development. In addition, as disclosed in '041' patent, the dielectric layer not only contacts the bottom electrode, but also contacts edges of the barrier layer, which is also undesirable.

Accordingly, a need exists in the art to overcome not only the problems associated with the prior art device shown in FIG. 1 herein, but also problems associated with the process for forming a capacitor structure as disclosed in '041' patent.

Figure 1:
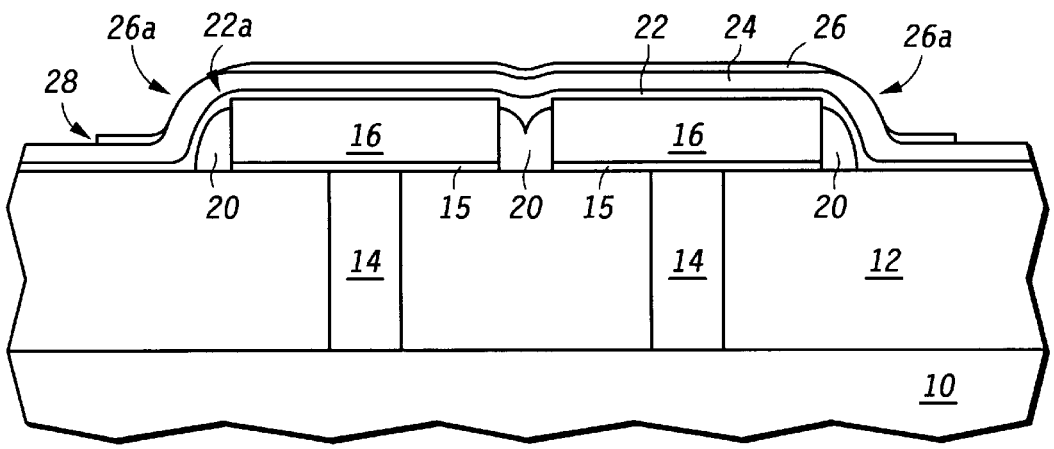
FIG. 1 illustrates, in cross-sectional diagram, a prior art capacitor device.

It will be appreciated that for simplicity and clarity of illustration elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE DRAWINGS

Generally, the present invention is a new process for forming a lower capacitor electrode, such as would be used in a DRAM or a ferroelectric non-volatile memory device. Specifically, an oxygen tolerant bottom electrode layer is formed over a conductive plug. Next, a dielectric layer is deposited and partially removed in order to form an inlaid bottom electrode structure. Subsequent to forming the inlaid bottom electrode, a capacitor dielectric such as BST is formed over the lower electrode. The upper electrode is formed over the capacitor dielectric and the resulting stack is patterned in order to form a final capacitive device. A related application having application Ser. No. 08/963,443, by Bruce E. White et al., is hereby incorporated by reference.

By forming the capacitive structure in this manner, problems associated with the prior art are overcome. Specifically, pinch-off regions associated with a non planar bottom electrode are avoided. In addition, a thinning of hard mask layers on non-planar edges is avoided. The present invention is best understood with reference to FIGS. 2 through 10.

Figure 2:
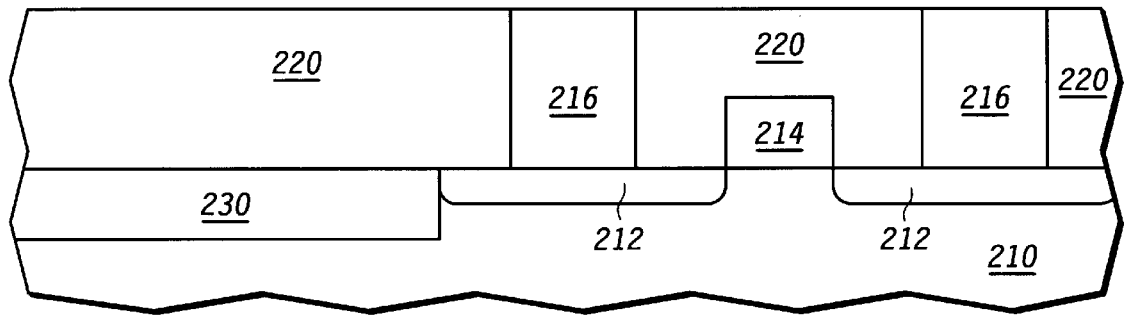
FIGS. 2 through 10 illustrate, in cross-sectional diagrams, a process for forming an improved capacitor structure in accordance with the present invention.

FIG. 2 illustrates an isolation region 230 formed in a substrate 210. The isolation region 230 can be formed using a trench or a grown oxide process. Furthermore, a lithographic patterning process has been used to form a gate structure 214. The gate structure 214 generally comprises a polysilicon or a metal gate. Subsequently, diffusion regions 212 are formed adjacent to the gate 214. Contacts 216 form an electrical connection to the diffusion regions 212, and are generally formed by patterning openings through an interlayer dielectric layer 220 to expose the diffusion regions 212, and filling the openings with a conductive material.

Figure 3:
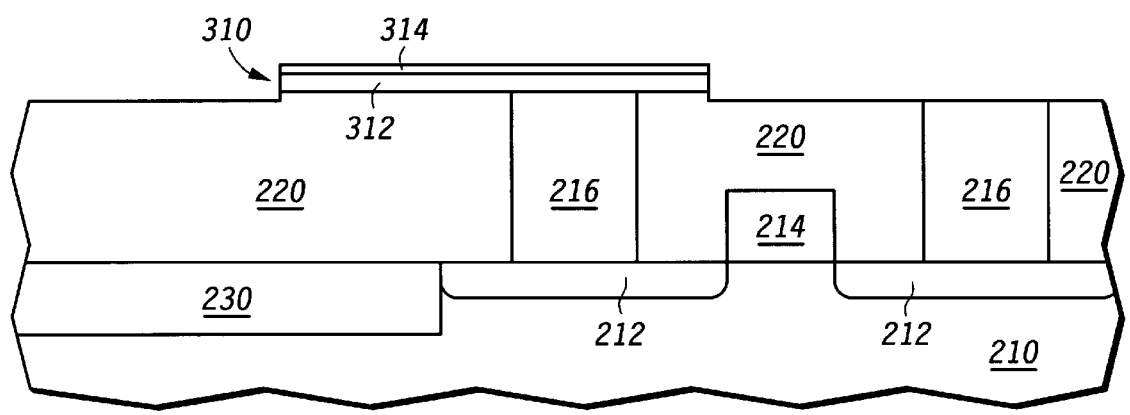

In FIG. 3 a bottom electrode 310 has been formed. In the embodiment illustrated, the bottom electrode 310 comprises a barrier layer 312 and an interfacial layer 314. The barrier layer 312 prevents the interfacial layer 314 material from interacting with the contact region 216 during high temperature anneal processes. Furthermore, the barrier layer 312 prohibits oxygen from diffusing through the electrode 310 to the contacts 216. In addition, the barrier layer 312 defines the lateral diffusion length through the dielectric layer 220. Suitable materials for the barrier layer 312 include conductive metal oxides and nitrides. For example, iridium, iridium oxide, titanium nitride, titanium aluminum nitride, tantalum nitride, tantalum aluminum nitride, ruthenium, and ruthenium oxide.

The interfacial layer 314 functions to provide appropriate capacitive properties for the bottom electrode 310. Specifically, high dielectric dispersion or oxidation of the conductive barrier are known problems when high dielectric constant oxide materials contact the barrier layer 312 materials indicated. Therefore, the use of an interfacial layer which minimizes the amount of dielectric dispersion is advantageous. Examples of such an interfacial layers 314 would include platinum and palladium. The bottom electrode 310, when formed using a barrier layer and interfacial layer, functions to protect the contact 216 from oxidation and provides for appropriate capacitive properties.

Figure 4:
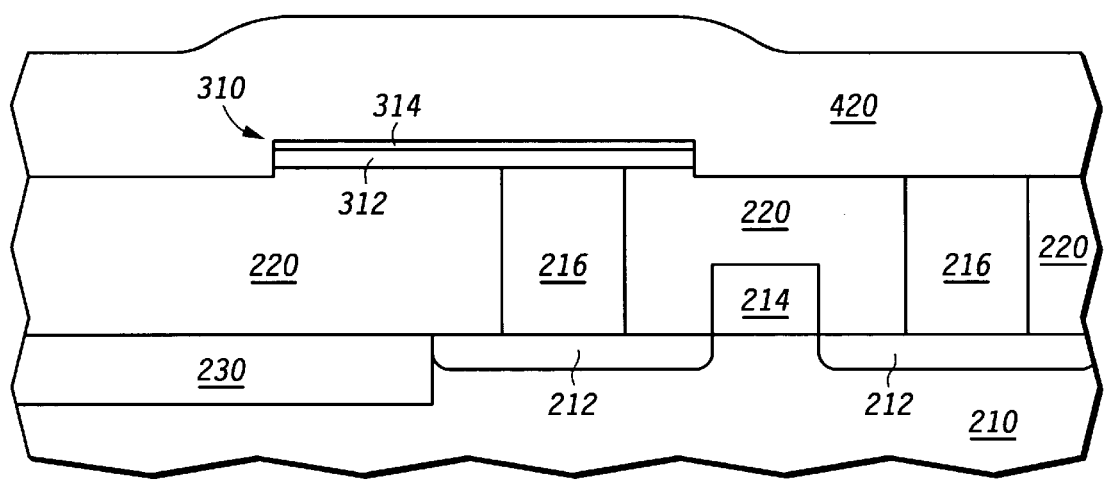
Figure 5:
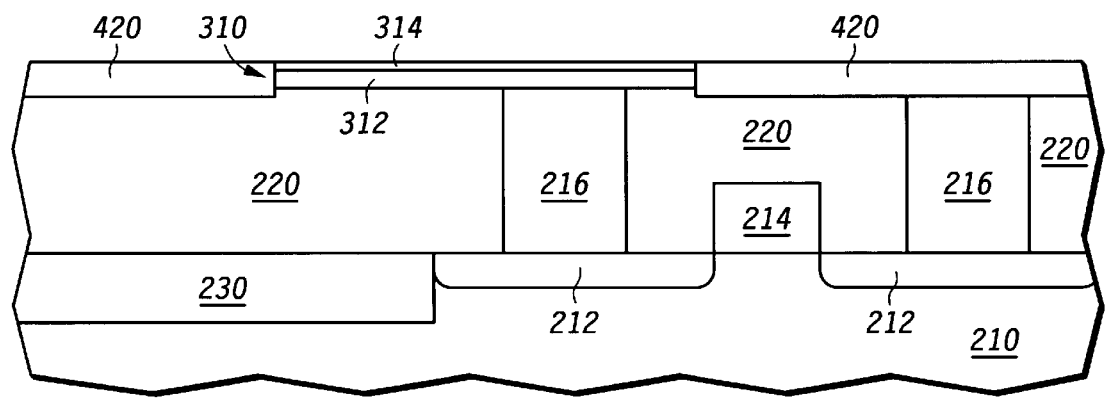

FIG. 4 illustrates the formation of a second dielectric layer 420 over the bottom electrode 310. This second dielectric layer 420 is partially removed in order to expose the upper surface of the bottom electrode 310 as illustrated in FIG. 5 to form an inlaid structure. The second dielectric layer 420 may be formed using a high density plasma technique which may be advantageous for the partial removal. The partial removal of the second dielectric layer 420 can be accomplished in several manners. One embodiment of removing the portion of the second dielectric layer 420 is illustrated in FIG. 6.

Figure 6:
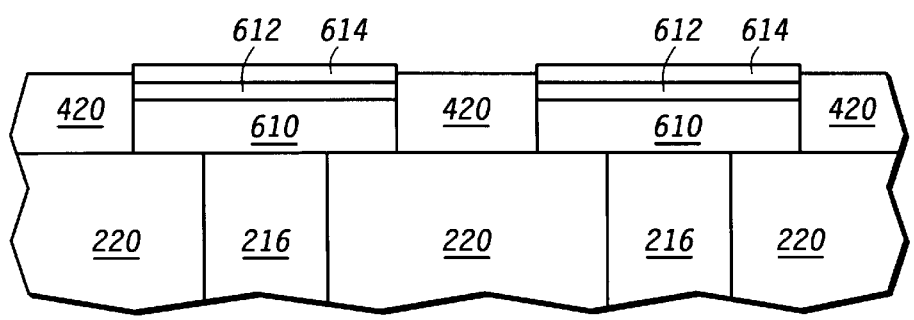
Figure 7:
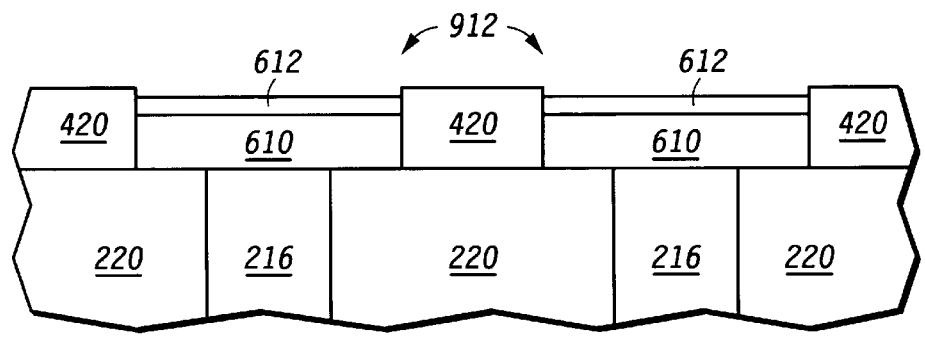

FIG. 6 illustrates a lower electrode having a barrier layer 610, an interfacial layer 612, and a hard mask layer 614. The hard mask layer 614 is highly selective to the second dielectric layer 420. Specifically, the hard mask layer 614 could include such materials as titanium nitride or tantalum nitride. Subsequent to the formation of the second dielectric layer 420 over the bottom electrode, the second dielectric layer 420 would be removed to expose the top surface of the hard mask layer 614. In that it is possible during the removable of the dielectric layer to cause physical or chemical damage to the surface of the bottom electrode, and specifically the hard mask layer in FIG. 6, a subsequent step, illustrated in FIG. 7, can be used to selectively remove the hard mask layer exposing the underlying interfacial layer 612. In this manner, as illustrated in FIG. 7, lower electrodes 912 are formed which are slightly recessed below the top surface of the dielectric material 420. This is advantageous in that the newly exposed top surface of the bottom electrodes would be substantially planer, would not be damaged by the partial removal of the second dielectric layer 420, and in addition, this process would allow for more latitude and overall process control of formation of the bottom electrode.

In another embodiment not illustrated, it would be possible to perform a partial CMP of the second dielectric layer without exposing the underlying bottom electrode. The remainder of the second dielectric layer higher than the surface of the electrode could then be removed using a reactive ion etch back process. The advantage of using a reactive ion etch back process in association with a partial CMP is that the use of the reactive ion etch back allows for a more uniform control across the entire wafer surface, than would generally be available using a CMP down to the bottom electrode process.

Referring again to FIG. 5, and as previously indicated, a CMP process could be used in order to partially remove the dielectric layer 420 to expose the bottom electrode 310. However, as discussed with the specific embodiments, it may be advantageous to use either a hard mask layer as discussed with reference to FIG. 6, or only a partial CMP process as previously discussed in order to assure more uniform processing control across the wafer surface and minimize damage to the surface of the bottom electrode caused by the CMP processes.

Figure 8:
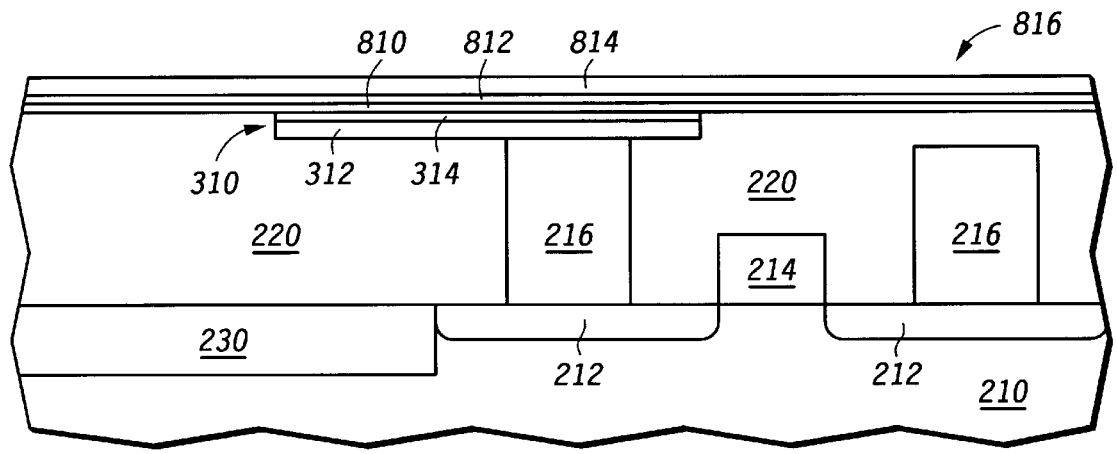
Figure 9:
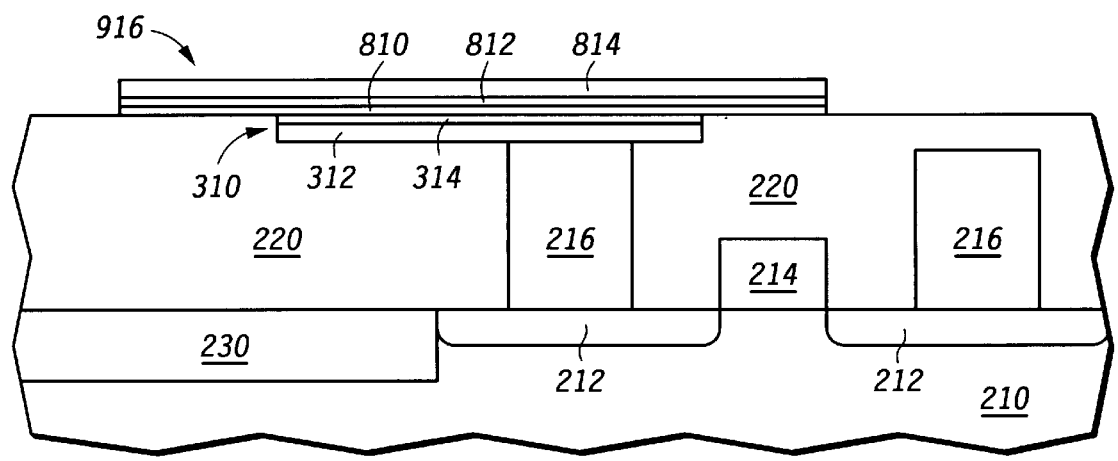

FIG. 8 illustrates the formation of a capacitor dielectric layer 810, a top electrode 812, and a top electrode hard mask layer 814. Generally, these layers will be formed in a blanket layer and subsequently patterned and etched to form the top capacitor dielectric as illustrated in FIG. 9. The capacitor dielectric layer 810, will generally be formed of barium strontium titanium oxide (BST), lead zirconium titanium oxide (PZT), or strontium bismuth tantalum oxide (SBT). In addition, other appropriate high K dielectric, or ferroelectric dielectrics may be used in the formation of the capacitor dielectric layer 810. The top electrode 812, generally consists of a metal layer which would be comprised of one of the group of materials indicated as part of the interfacial layer for the lower electrode. However, there is no need for the upper electrode and lower electrode to be matched in material type. A top electrode hard mask layer 814 would generally be comprised of titanium nitride or tantalum nitride in order to facilitate the formation of the final upper electrode dimensions.

Figure 10:
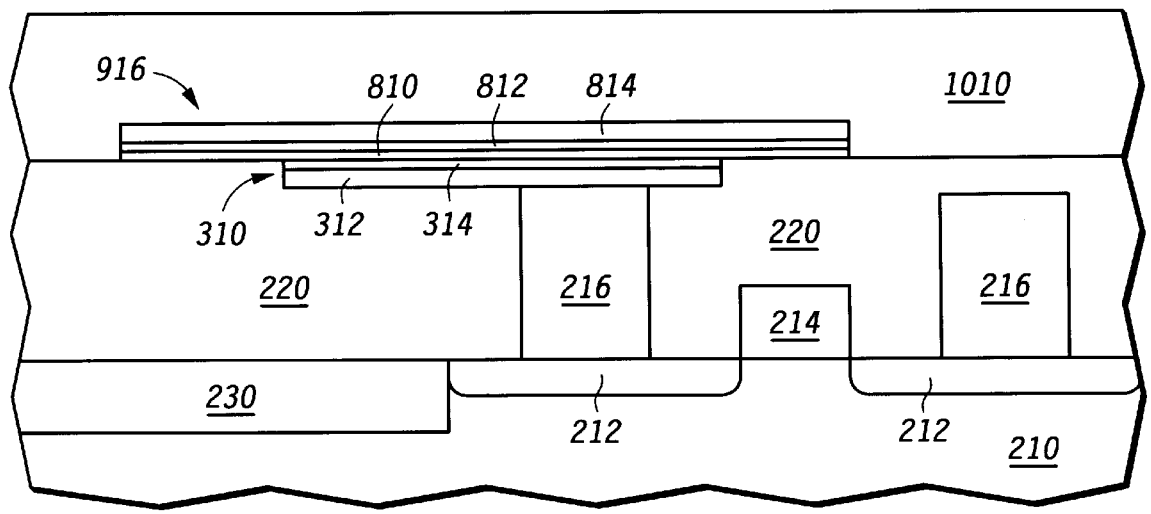

FIG. 10 illustrates the capacitor structure following the formation of a third interlevel dielectric layer 1010. The interlevel dielectric layer 1010 isolates the capacitive structure from any subsequent processing layers and steps.

The present invention provides for numerous advantages over the prior art. Specifically, embodiments of the present invention limit formation of a hardmask over non-planar portions of the electrode. This reduces the thinning of the hard mask surface on non-horizontal edges. Furthermore, because of the generally planar structure of the capacitor of the present invention, problems associated with pinch-off of the capacitive dielectric material is also reduced. In addition, embodiments associated with the present invention allow for a smooth surface of the capacitor electrode as compared to the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A method for forming a semiconductor device structure, comprising the steps of:
   providing a semiconductor substrate;
   forming a first dielectric layer over the semiconductor substrate, the first dielectric layer having a filled opening forming a conductive region;
   forming bottom electrode layer overlying the first dielectric layer and in electrical contact with the conductive region;
   patterning the bottom electrode layer to form a bottom electrode;
   depositing a second dielectric layer overlying the bottom electrode and the first dielectric layer;
   removing a portion of the second dielectric layer to expose the bottom electrode, wherein the bottom electrode layer is inlaid in the second dielectric layer;
   forming a capacitor dielectric overlying the bottom electrode; and
   forming a top electrode overlying the capacitor dielectric.

2. The method of claim 1, wherein said portion of the second dielectric layer is removed by chemical mechanical polishing the second dielectric layer.

3. The method of claim 1, wherein said portion of the second dielectric layer is removed by chemical mechanical polishing the second dielectric layer, followed by etching the second dielectric layer.

4. The method of claim 3, wherein the etching is carried out by reactive ion etching.

5. The method of claim 1, further comprising forming a hard mask over the bottom electrode layer, for patterning the bottom electrode layer, wherein (i) the second dielectric layer is formed so as to overlie the hard mask, and (ii) the hard mask is removed after said step of removing, thereby exposing the bottom electrode.

6. The method of claim 1, wherein the conductive region comprises a contact extending through the first dielectric layer.

7. The method of claim 6, further comprising a step of forming an active device along the semiconductor substrate, wherein the contact makes electrical contact between the active device and the bottom electrode.

8. The method of claim 7, wherein the active device comprises a diffusion region in the semiconductor substrate, the contact making electrical contact to the diffusion region.

9. The method of claim 6, wherein the contact comprises a material from a group consisting of tungsten and polysilicon.

10. The method of claim 1, wherein the step of forming the second dielectric layer is carried out by high density plasma deposition.

11. The method of claim 1, wherein the bottom electrode layer has a composite layered structure, including an oxygen barrier layer in contact with the conductive region, and an interfacial layer overlying the oxygen barrier layer.

12. The method of claim 11, wherein the oxygen barrier layer comprises a material from a group consisting of iridium, iridium oxide, ruthenium, ruthenium oxide, titanium nitride, titanium aluminum nitride, tantalum nitride, and tantalum aluminum nitride.

13. The method of claim 11, wherein the interfacial layer comprises a material from a group consisting of platinum and palladium.

14. The method of claim 1, wherein the capacitor dielectric and the top electrode are formed by depositing a capacitor dielectric layer overlying the bottom electrode and a top electrode layer overlying the capacitor dielectric layer, forming a masking layer over the top electrode layer, patterning the masking layer, and patterning the top electrode layer and the capacitor dielectric layer.

15. The method of claim 1, wherein the capacitor dielectric comprises a material selected from a group consisting of barium titanate, strontium titanate, and barium strontium titanate, lead titanate, lead zirconate titanate, strontium bismuth tantalate, and strontium bismuth niobate tantalate.

16. A method for forming a semiconductor device, comprising the steps of:
   providing a semiconductor substrate;
   forming an active device along the semiconductor substrate, the active device including a first diffusion region and a second diffusion region separated from each other by a gate electrode;
   forming a first dielectric layer over the semiconductor substrate;
   forming an opening in the first dielectric layer, the opening extending to one of said first diffusion region and the second diffusion region;
   filling the opening with a conductive material to form a contact to one of said first diffusion region and said second diffusion region;
   forming a bottom electrode layer overlying the contact;
   patterning the bottom electrode layer to form a bottom electrode;
   depositing a second dielectric layer overlying the bottom electrode;
   removing a portion of the second dielectric layer to expose the bottom electrode, wherein the bottom electrode layer is inlaid in the second dielectric layer;
   forming a capacitor dielectric overlying the bottom electrode, wherein the capacitor dielectric is exposed to an oxygen-containing ambient at an elevated temperature within a range of 400 to 800 degrees C.; and
   forming a top electrode overlying the capacitor dielectric.

17. The method of claim 16, wherein the capacitor dielectric is deposited in an inert ambient, followed by exposure to said oxygen-containing ambient at said elevated temperature.

18. The method of claim 16, wherein the capacitor dielectric is formed in said oxygen-containing ambient at said elevated temperature.

19. The method of claim 16, wherein said portion of the second dielectric layer is removed by chemical mechanical polishing the second dielectric layer.

20. The method of claim 16, wherein said portion of the second dielectric layer is removed by chemical mechanical polishing the second dielectric layer, followed by etching the second dielectric layer.

21. The method of claim 20, wherein the etching is carried out by reactive ion etching.

22. The method of claim 16, further comprising forming a hard mask over the bottom electrode layer, for patterning the bottom electrode layer, wherein (i) the second dielectric layer is formed so as to overlie the hard mask, and (ii) the hard mask is removed after said step of removing, thereby exposing the bottom electrode.

23. The method of claim 16, wherein the contact comprises a material from a group consisting of tungsten and polysilicon.

24. The method of claim 16, wherein the step of forming the second dielectric layer is carried out by high density plasma deposition.

25. The method of claim 16, wherein the bottom electrode layer has a composite layered structure, including an oxygen barrier layer in contact with the contact, and an interfacial layer overlying the oxygen barrier layer.

26. The method of claim 25, wherein the oxygen barrier layer comprises a material from a group consisting of iridium, iridium oxide, ruthenium, ruthenium oxide, titanium nitride, titanium aluminum nitride, tantalum nitride, and tantalum aluminum nitride.

27. The method of claim 25, wherein the interfacial layer comprises a material from a group consisting of platinum and palladium.

28. The method of claim 16, wherein the capacitor dielectric and the top electrode are formed by depositing a capacitor dielectric layer overlying the bottom electrode and a top electrode layer overlying the capacitor dielectric layer, forming a masking layer over the capacitor dielectric layer, patterning the masking layer, and patterning the top electrode layer and the capacitor dielectric layer.

29. The method of claim 16, wherein the capacitor dielectric comprises a material selected from a group consisting of barium titanate, strontium titanate, and barium strontium titanate, lead titanate, lead zirconate titanate, strontium bismuth tantalate, and strontium bismuth niobate tantalate.

* * * * *